US011211585B2

United States Patent
Choi et al.

(10) Patent No.: US 11,211,585 B2
(45) Date of Patent: Dec. 28, 2021

(54) FLEXIBLE SUBSTRATE AND FLEXIBLE ORGANIC LIGHT EMITTING DIODE DEVICE

(71) Applicant: LG Display Co., Ltd., Seoul (KR)

(72) Inventors: Nack-Bong Choi, Paju-si (KR); Byung-Su Ahn, Paju-si (KR); Yoon-Dong Cho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/701,596

(22) Filed: Dec. 3, 2019

(65) Prior Publication Data
US 2020/0194719 A1 Jun. 18, 2020

(30) Foreign Application Priority Data
Dec. 13, 2018 (KR) ........................ 10-2018-0160973

(51) Int. Cl.
*H01L 51/52* (2006.01)
*H01L 51/00* (2006.01)
*G09F 9/30* (2006.01)

(52) U.S. Cl.
CPC .......... *H01L 51/5253* (2013.01); *G09F 9/301* (2013.01); *H01L 51/0097* (2013.01); *H01L 2251/30* (2013.01)

(58) Field of Classification Search
CPC ............. H01L 51/5253; H01L 51/0097; H01L 2251/30; H01L 2251/5338; H01L 51/524; H01L 27/3244; G09F 9/301; Y02E 10/549
See application file for complete search history.

(56) References Cited

U.S. PATENT DOCUMENTS

| 2009/0290117 | A1* | 11/2009 | Watanabe | G02F 1/1339 349/153 |
| 2009/0297869 | A1* | 12/2009 | Gomi | B32B 37/00 428/448 |
| 2014/0346473 | A1* | 11/2014 | Park | H01L 51/5253 257/40 |
| 2019/0088685 | A1* | 3/2019 | Huang | H01L 27/1244 |

* cited by examiner

*Primary Examiner* — Kyoung Lee
(74) *Attorney, Agent, or Firm* — Morgan, Lewis & Bockius LLP

(57) ABSTRACT

A flexible substrate includes a first flexible thin film including a first region and a second region surrounding the first region; a second flexible thin film on the first thin film and in the first and second regions; and an intermediate blocking layer between the first and second thin films and in the first region.

24 Claims, 8 Drawing Sheets

FLEXIBLE SUBSTRATE AND FLEXIBLE ORGANIC LIGHT EMITTING DIODE DEVICE

CROSS-REFERENCE TO RELATED APPLICATIONS

This application claims priority to and the benefit of Korean Patent Application No. 10-2018-0160973 filed in the Republic of Korea on Dec. 13, 2018, which is hereby incorporated by reference in its entirety.

BACKGROUND

Technical Field

Embodiments of the disclosure relate to an organic light emitting diode (OLED) device, and more particularly, to a flexible substrate capable of preventing penetration of moisture and/or oxygen as well as a peeling problem, and a flexible OLED device including the flexible substrate.

Discussion of the Related Art

As information technology and mobile communication technology have developed, a display device having a thin profile and low weight has also been developed. Among flat panel display devices, the OLED device as a self-emission type has excellent characteristics of thin profile and light weight without a required backlight unit as in the LCD device. In addition, the OLED display device has advantages of viewing angle, contrast ratio, low power consumption, low-voltage driving and fast response time. Moreover, because the OLED device includes solid elements, the OLED device has advantages in outer impact durability and an operation temperature range. Further, because the organic light emitting diode is fabricated by a thin organic film, which has a flexible and/or elastic property, the organic light emitting diode may be used for a flexible display device.

In the flexible OLED device, plastic or thin metal foil is used for a flexible substrate. For example, a polyimide substrate is generally used for the flexible OLED device. The polyimide substrate has thermal durability for the manufacturing process of the OLED device. However, when the polyimide substrate is used for the flexible OLED device, the thin film transistor is thermally degraded such that the reliability of the flexible OLED device is decreased.

SUMMARY

Accordingly, embodiments of the present disclosure are directed to a flexible substrate and a flexible OLED device including the same that substantially obviate one or more of the problems due to limitations and disadvantages of the related art.

Features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a flexible substrate comprises a first flexible thin film including a first region and a second region surrounding the first region; a second flexible thin film on the first thin film and in the first and second regions; and an intermediate blocking layer between the first and second thin films and in the first region.

In another aspect, a flexible organic light emitting diode device comprises a flexible substrate including a first flexible thin film, a second flexible thin film, and an intermediate blocking layer between the first and second flexible thin films, wherein the flexible substrate having a first region and a second region surrounding the first region, and a plurality of pixel regions are defined in the first region; a thin film transistor in each pixel region; and a light emitting diode in each pixel region and connected to the thin film transistor, wherein the intermediate blocking layer is in the first region such that the first flexible thin film directly contacts the second flexible thin film in at least one part of the second region.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Reference will now be made in detail to embodiments of the disclosure, examples of which are illustrated in the accompanying drawings.

Figure 1:
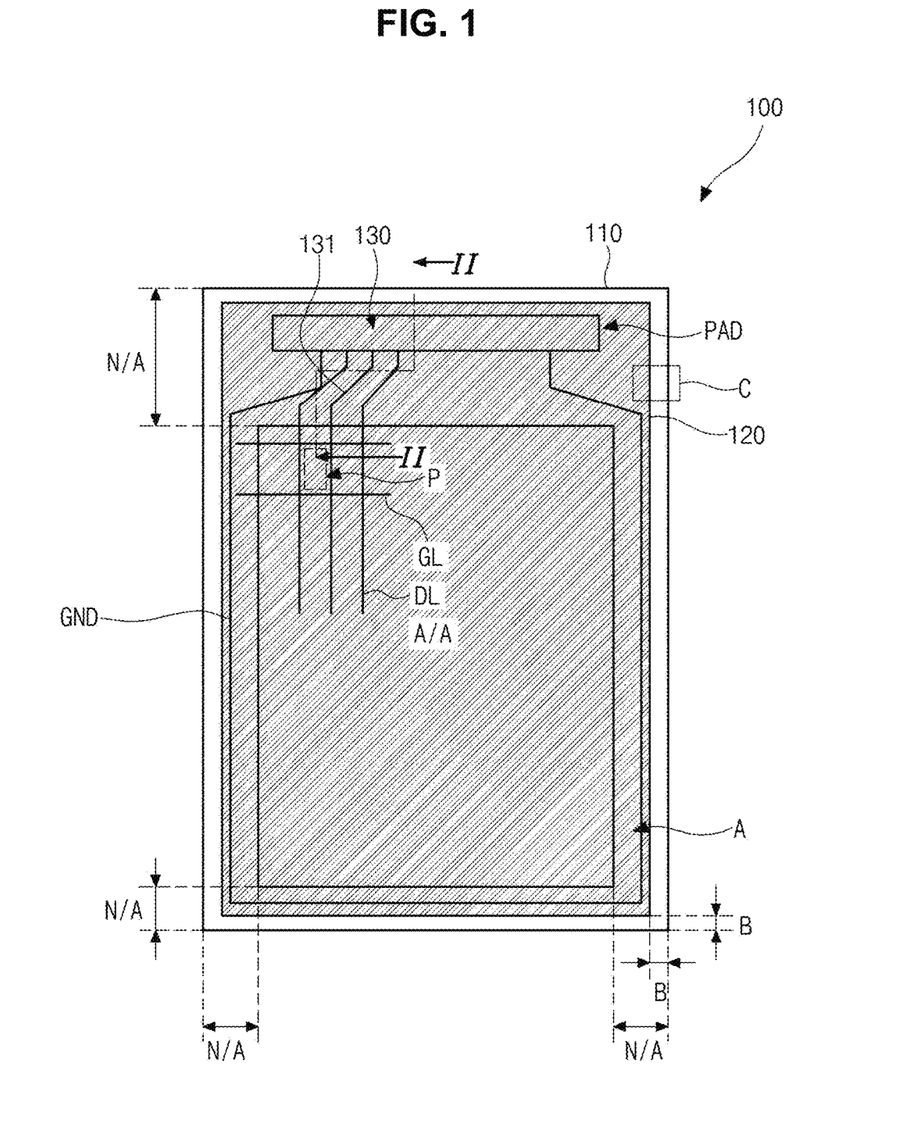
FIG. 1 is a schematic plan view of a flexible OLED device according to an embodiment of the present disclosure.

FIG. 1 is a schematic plan view of a flexible OLED device according to an embodiment of the present disclosure.

As shown in FIG. 1, a flexible OLED device 100 includes a transparent flexible substrate 110, a thin film transistor (TFT) DTr (of FIG. 2) on the transparent flexible substrate 110 and a light emitting diode E (of FIG. 2) connected to the TFT DTr. A display area A/A, e.g., an active area, and a non-display area N/A at peripheries of the display area A/A are defined on the flexible substrate 110. The light emitting diode E is disposed in the display area A/A such that the image is displayed in the display area A/A.

In the display area A/A, a plurality of gate lines GL and a plurality of data lines DL cross each other to define a plurality of pixel regions P. In each pixel region P, the light emitting diode E and the TFT DTr, which is connected to the light emitting diode E, are disposed, and the TFT DTr is operated by a driving unit (not shown) such that the current to the light emitting diode E is controlled.

The non-display area N/A includes a pad region PAD, which may be positioned at an upper side of the display area A/A, and a pad 130 is formed in the pad region PAD. The pad 130 is connected to a circuit film (not shown), such as a flexible printed circuit board (FPCB), and acts as a connection terminal connecting the circuit film and the lines 131, e.g., the data line DL. A data driving unit and a gate driving unit for providing a driving signal to the TFT DTr may be formed on the circuit film, such as the FPCB. Alternatively, the data driving unit and the gate driving unit may be formed in a chip-on-film (COF) type or a tape-carrier-package (TCP) type to be connected to the pad region PAD on the flexible substrate 110.

The plurality of lines 131 are disposed between the pad region PAD and the display area A/A, and electric signals via the pad 130 are provided into the TFT DTr in the display area A/A by the lines 131. In addition, a ground line GND is formed to surround the display area A/A, and a ground voltage is provided into the ground line GND.

In the flexible OLED device 100, an intermediate blocking layer 120 is disposed on the flexible substrate 110. The intermediate blocking layer 120 has a size, e.g., a plan area, being smaller than the flexible substrate 110 such that the flexible substrate 110 may be divided into a first region A, where the intermediate blocking layer 120 is disposed, and a second region B, where the intermediate blocking layer 120 is not disposed.

As mentioned above, the polyimide substrate as the flexible substrate has good thermal durability. However, the polyimide substrate has a significant disadvantage in moisture absorption (high hydroscopic property) such that the thin film transistor is thermally degraded.

In the flexible OLED device 100, the intermediate blocking layer 120 is formed on the flexible substrate 110, which may be formed of polyimide, and in the display area A/A such that the thermal degradation of the TFT DTr is prevented and the reliability of the flexible OLED device 100 is improved. In addition, because a crack in the flexible substrate 110 is prevented by the intermediate blocking layer 120, the penetration of moisture and/or oxygen into an inner side of the flexible OLED device 100 is blocked or prevented. Accordingly, a decrease in the reliability and the lifespan of the TFT DTr and the light emitting diode E is prevented.

Figure 2:
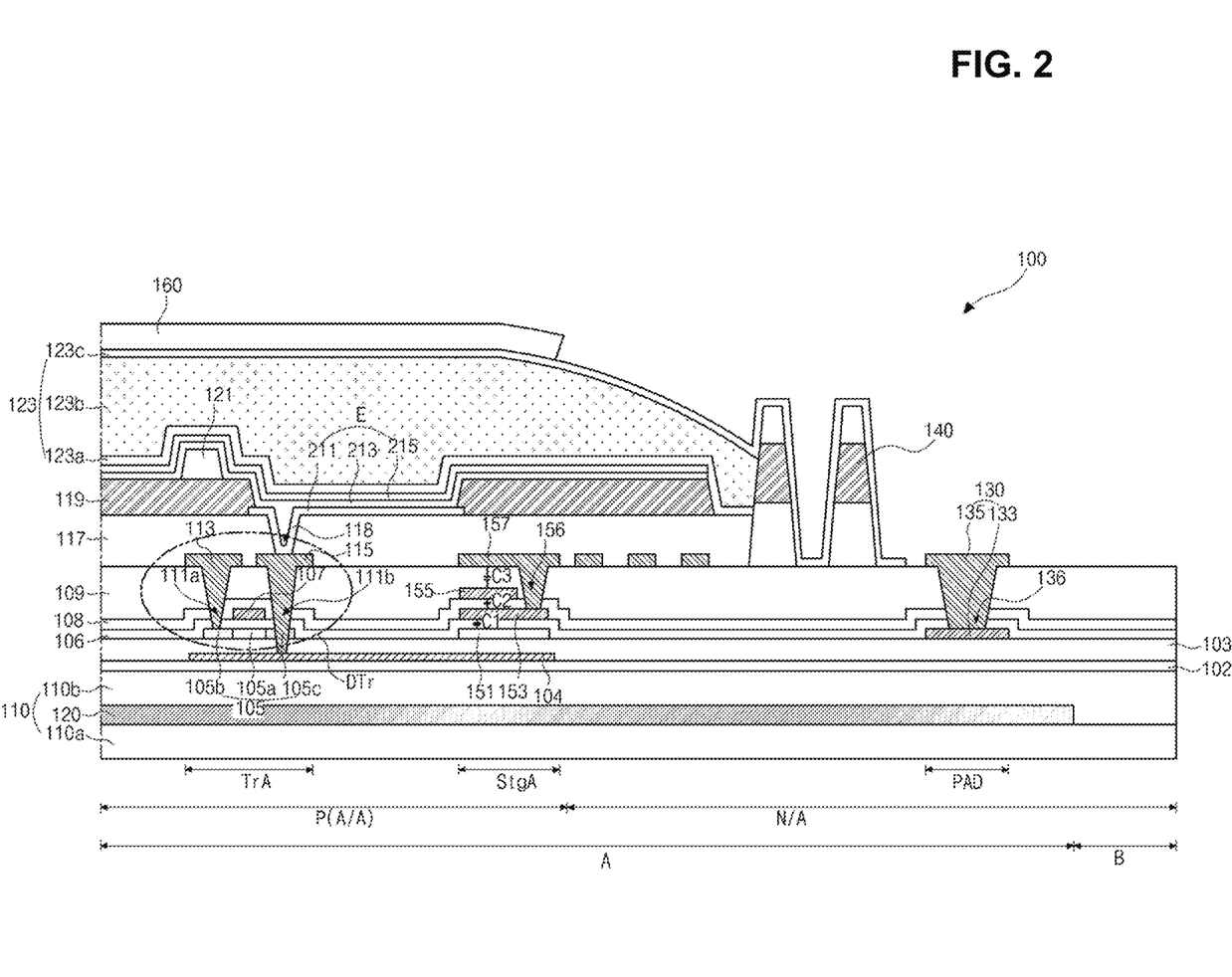
FIG. 2 is a schematic cross-sectional view taken along line II-II of FIG. 1.

FIG. 2 is a schematic cross-sectional view taken along line II-II of FIG. 1.

The flexible OLED device 100 may be classified into a top-emission type or a bottom-emission type depending on the transmittance direction of the emitted light. The top-emission type flexible OLED device will be explained, but it is not limited thereto.

As shown in FIG. 2, the display area A/A and the non-display area N/A are defined on the flexible substrate 110. The non-display area N/A may be positioned at a side of the display area A/A.

The plurality of pixel regions P are arranged in the display area A/A such that the image is displayed at the display area A/A. The non-display area N/A is an outer area of the display area A/A, and various circuits and/or various lines for driving the pixel region P are disposed in the non-display area N/A.

For the sake of explanation, a switching region TrA, where the TFT DTr is disposed, and a storage region StgA, where storage capacitors C1, C2, and C3 are disposed, are defined in each pixel P of the display area A/A, and the pad region PAD, where the pad 130 is disposed, is defined in the non-display area N/A.

A buffer layer 102, e.g., a first buffer layer, is formed on the flexible substrate 110. The buffer layer 102 has a size (plane area) being the same as the flexible substrate 110 such that an upper surface of the flexible substrate 110 is covered with the buffer layer 102. The buffer layer 102 may have a single-layered structure or a multi-layered structure. For example, a silicon nitride layer and a silicon oxide layer may be alternately stacked to form the buffer layer 102. Alternatively, an organic layer and an inorganic layer may be alternately stacked to form the buffer layer 102. The diffusion of moisture and/or oxygen from the flexible substrate 110 to the TFT DTr and/or the light emitting diode E is delayed by the buffer layer 102.

An active buffer layer 103, e.g., a second buffer layer, may be further formed on the buffer layer 102 to protect an active layer 105 of the TFT DTr. The defects and the foreign substances from the flexible substrate 110 into the active layer 105 may be blocked by the active buffer layer 103. The active buffer layer 103 may be formed of the same material as the buffer layer 102. Alternatively, the active buffer layer 103 may be formed of amorphous silicon.

The TFT DTr is positioned on the active buffer layer 103 and in the switching region TrA. The TFT DTr includes the active layer 105 of poly-silicon. For example, a low-temperature poly-silicon (LTPS) TFT may be used. The polycrystalline silicon has high mobility such that the TFT DTr including the active layer 105 of poly-silicon has low power consumption and high reliability.

The active layer 105 on the active buffer layer 103 includes a channel region 105a, a source region 105b and a drain region 105c. The source region 105b and the drain region 105c are positioned at both sides of the channel region 105a, respectively. The channel region 105a, the source region 105b and the drain region 105c are defined depending on an ion doping (impurity doping).

An active pattern 151 is formed in the storage region StgA. The active pattern 151 includes poly-silicon, and impurity is doped such that the active pattern 151 has a conductive property.

A gate insulating layer 106 is formed on the active layer 105 and the active pattern 151. The gate insulating layer 106 may have a single-layered structure formed of silicon nitride or silicon oxide. Alternatively, the gate insulating layer 106 may have a multi-layered structure including at least one silicon nitride layer and at least one silicon oxide layer.

A gate electrode 107, which corresponds to and overlaps the channel region 105a of the active layer 105, is formed on the gate insulating layer 106 and in the switching region TrA. In addition, the gate line GL (of FIG. 1) extending along one direction is formed on the gate insulating layer 106. Moreover, a first metal pattern 153, which corresponds to and overlaps the active pattern 151, is formed on the gate insulating layer 106.

The gate electrode 107, the gate line GL and the first metal pattern 153 may be formed of the same material. For example, the gate electrode 107, the gate line GL and the first metal pattern 153 may be formed of a low resistance metallic material, such as aluminum (Al), Al alloy (AlNd), copper (Cu), Cu alloy, molybdenum (Mo), or Mo-titanium alloy (MoTi). The gate electrode 107, the gate line GL and the first metal pattern 153 may have a single-layered structure or a multi-layered structure.

A first interlayer insulating layer 108 is formed on the gate electrode 107, the gate line GL and the first metal pattern 153. The first interlayer insulating layer 108 is formed of silicon nitride. In the hydrogenization process for stabilizing the active layer 105, the hydrogen in the first interlayer insulating layer 108 of silicon nitride is sufficiently diffused into the active layer 105.

A second metal pattern 155, which corresponds to and overlap the first metal pattern 153, is formed on the first interlayer insulating layer 108 and in the storage region StgA. The second metal pattern 155 may be formed of Al, Cu, Mo, chromium (Cr), nickel (Ni), tungsten (W) or their alloy, but it is not limited thereto. The second metal pattern 155 may have a single-layered structure or a multi-layered structure.

A second interlayer insulating layer 109 is formed on the first interlayer insulating layer 108 and the second metal pattern 155. The second interlayer insulating layer 109 is formed over an entire surface of the flexible substrate 110 and may be formed of silicon oxide.

First and second contact holes 111a and 111b, which respectively expose the source region 105b and the drain region 105c, are formed through the gate insulating layer 106, the first interlayer insulating layer 108 and the second interlayer insulating layer 109. In addition, a third contact hole 156 exposing the first metal pattern 153 in the storage region StgA is formed through the first interlayer insulating layer 108 and the second interlayer insulating layer 109.

A source electrode 113 and a drain electrode 115 are formed on the second insulating layer 109 and in the switching region TrA. The source electrode 113 and the drain electrode 115 are respectively connected to the source region 105b and the drain region 105c through the first and second contact holes 111a and 111b. For example, the source electrode 113 and the drain electrode 115 may be formed of a low resistance metallic material, such as Al, Al alloy, Cu, Cu alloy, Mo, MoTi, Cr, Ti, or their combination. The source electrode 113 and the drain electrode 115 may have a single-layered structure or a multi-layered structure.

The data line DL (of FIG. 1), which crosses the gate line GL to define the pixel region P, is formed on the second insulating layer 109. The source electrode 113, the drain electrode 115, the active layer 105, and the gate electrode 107 constitute the TFT DTr serving as a driving element. Although not shown, a switching TFT, which may have substantially the same structure as the TFT DTr and serve as a switching element, is further formed to be connected to the TFT DTr.

In FIG. 2, the TFT DTr has a top gate structure. Alternatively, the TFT DTr may have a bottom gate structure having the active layer 105. In this instance, the active layer may be formed of intrinsic amorphous silicon and impurity-doped amorphous silicon. The active layer 105 is formed of polysilicon. Alternatively, the active layer 105 may be formed of an oxide semiconductor material.

A bottom shield metal pattern 104 is disposed between the buffer layer 102 and the active buffer layer 103 and may include Mo. The bottom shield metal pattern 104 corresponds to the switching region TrA and the storage region StgA. Alternatively, the bottom shield metal pattern 104 may correspond to only the switching region TrA.

The change of the property, e.g., a threshold voltage, of the TFT DTr by outer moisture is prevented by the bottom shield metal pattern 104. Accordingly, the defects, e.g., the residual image, resulting from the brightness non-uniformity in the pixel regions P may be prevented by the bottom shield metal pattern 104.

In addition, damage to the TFT DTr in the process of forming the flexible substrate 110 may be prevented, minimized, or at least reduced by the bottom shield metal pattern 104. For example, when a laser beam is irradiated to detach the flexible substrate 110 from a carrier substrate, the TFT DTr may be damaged by the laser beam without the bottom shield metal pattern 104. Yet further, the bottom shield metal pattern 104 can shield the active layer 105 from light during operation.

One of the source electrode 113 and the drain electrode 115 is electrically connected to the bottom shield metal pattern 104 such that the change of electric potential of the bottom shield metal pattern 104 and/or the change of the threshold voltage of the TFT DTr may be prevented. When the bottom shield metal pattern 104 is floated, the change amount of the threshold voltage of the TFT DTr may be different in each pixel region P such that there is a undesired brightness difference in each pixel P.

However, when the drain electrode 115 is electrically connected to the bottom shield metal pattern 104, the bottom shield metal pattern 104 and the drain electrode 115 are to be equipotential. Accordingly, the voltage difference between the bottom shield metal pattern 104 and the drain electrode 115 is smaller than the voltage difference between the gate electrode 107 and the source electrode 113 such that the threshold voltage shift of the TFT DTr by the bottom shield metal pattern 104 is minimized or reduced. For example, the second contact hole 111b may extend to expose the bottom shield metal pattern 104, and the drain electrode 115 may contact the bottom shield metal pattern 104 through the second contact hole 111b.

A third metal pattern 157, which corresponds to and overlaps the second metal pattern 155, is formed on the second insulating layer 109 and in the storage region StgA. The third metal pattern 157 is connected to the first metal pattern 153 through the third contact hole 156 in the first and second interlayer insulating layers 108 and 109.

The active pattern 151 serves as a first electrode (lower electrode) of a first storage capacitor C1, and the first metal pattern 153 serves as a second electrode (upper electrode) of the first storage capacitor C1 and a first electrode (lower electrode) of a second storage capacitor C2. The second metal pattern 155 serves as a second electrode (upper electrode) of the second storage capacitor C2 and a first electrode (lower electrode) of a third storage capacitor C3. In addition, the third metal pattern 157 serves as a second electrode (upper electrode) of the third storage capacitor C3.

The active pattern 151, the first metal pattern 153, and the gate insulating layer 106 therebetween constitute the first storage capacitor C1. The first metal pattern 153, the second metal pattern 155, and the first interlayer insulating layer 108 therebetween constitute the second storage capacitor C2. In addition, the second metal pattern 155, the third metal pattern 157, and the second interlayer insulating layer 109 therebetween constitute the third storage capacitor C3.

A passivation layer 117 including a drain contact hole 118, which exposes the drain electrode 115 of the TFT DTr, is formed on the source electrode 113, the drain electrode 115 and the third metal pattern 157. The passivation layer 117 may be formed of an inorganic insulating material, e.g., silicon nitride or silicon oxide. Alternatively, the passivation layer 117 may be formed of an organic material to provide a flat top surface.

For example, the passivation layer 117 may be formed of acrylate-based resin, epoxy-based resin, phenol-based resin, polyamide-based resin, polyimide-based resin, unsaturated polyester-based resin, polyphenylene-based resin, polyphenylenesulfide-based resin or benzocyclobutene, but it is not limited thereto. The passivation layer 117 may have a single-layered structure or a multi-layered structure.

The passivation layer 117 may have a thickness of about 2 to 5 micrometers to sufficiently cover a step difference on the flexible substrate 110. The passivation layer 117 covers an entire surface of the display area A/A and exposes a portion of the second interlayer insulating layer 109 in the non-display area N/A. The organic insulating material for the passivation layer 117 has weak resistivity against moisture and/or air such that moisture and/or air may penetrate into an inner side of the flexible OLED device 100 through an end of the passivation layer 117 of the organic insulating material.

However, in the flexible OLED device 100, because the end of the passivation layer 117 is disposed in the non-display area N/A and a dam 140 is formed at the end of the passivation layer 117 and on the second interlayer insulating layer 109 to cover the end of the passivation layer 117, the penetration of moisture and/or air through the end of the passivation layer 117 may be blocked.

The dam 140 surrounds the display area A/A, and an organic protective film 123b of an organic protective film 123 for protecting the elements of the flexible OLED device 100 from moisture and/or air (oxygen) is securely formed in a region surrounding the dam 140. The dam 140 may have a stack of a first pattern, which is formed of the same material and at the same layer as the passivation layer 117, a second pattern, which is formed of the same material and at the same layer as a bank 119, and a third pattern a spacer 121.

The lines 131 (of FIG. 1) are formed in the non-display area N/A to connect the pixel regions P to the pad 130 in the pad region PAD. The line 131 is formed of high conductive metallic material. For example, the line 131 may be formed of the same material as the source electrode 113 and/or the drain electrode 115 of the TFT DTr, but it is not limited thereto. The line 131 may be formed of the same material as the gate electrode 107 of the TFT DTr.

The pad 130, where the line 131 is connected in the pad region PAD, includes a first pad 133, which is formed of the same material as the gate electrode 107, and a second pad 135, which is formed of the same material as the source electrode 113 and/or the drain electrode 115. A fourth contact hole 136 exposing the first pad 133 is formed through the first and second interlayer insulating layers 108 and 109, and the second pad 135 contacts the first pad 133 through the fourth contact hole 136. The active buffer layer 103 and the buffer layer 102 are disposed under the first pad 133 such that the first pad 133 and the second pad 135 are protected from the moisture and/or oxygen, which may penetrate through the flexible substrate 110.

A first electrode 211 serving as an anode of the light emitting diode E is formed on the passivation layer 117. The first electrode 211 is connected to the drain electrode 115 of the TFT DTr through the drain contact hole 118.

The first electrode 211 may have high reflectance. For example, the first electrode 211 may have a single-layered structure of silver-palladium-copper alloy (Ag—Pd—Cu, APC) or a multi-layered structure of Al and Ti, Al and indium-tin-oxide (ITO) or APC and ITO. The multi-layered structure may be Ti/Al/Ti, ITO/Al/ITO or ITO/APC/ITO. The first electrode 211 is separated in each pixel region P, and a bank 119 is formed adjacent first electrode 211. Namely, the bank 119 covers an edge of the first electrode 211 and exposes a center of the first electrode 211.

A spacer 121 may be formed on the bank 119. The damage on an organic emitting layer 213 from an outer impact may be prevented by the spacer 121. The spacer 121 may be formed of the same material as the bank 119. The spacer 121 may be a black spacer, which has high light absorption property, thereby preventing light leakage into adjacent pixel regions P.

The organic emitting layer 213 is formed on the first electrode 211 and covers all of the pixel regions P as a common layer. The organic emitting layer 213 may be a white emitting layer.

The organic emitting layer 213 may include at least a two stack structure, e.g., a tandem structure. Each stack may include a hole transporting layer, at least one light emitting layer and an electron transporting layer. In addition, a charge generation layer, which includes an n-type charge generation layer and a p-type charge generation layer, may be formed between adjacent stacks. The n-type charge generation layer is positioned to be adjacent to a lower stack and provides an electron into the lower stack. The p-type charge generation layer is positioned on the n-type charge generation layer to be adjacent to an upper stack and provides a hole into the upper stack. The n-type charge generation layer may include an organic host material, which has an electron transporting property, and a dopant of alkali metal, e.g., Li, Na, K or Cs, or alkali earth metal, e.g., Mg, Sr, Ba or Ra. The p-type charge generation layer may include an organic host material, which has a hole transporting property, and a dopant.

A second electrode 215 serving as a cathode is formed on an entire surface of the organic emitting layer 213. The second electrode 215 covers all of the pixel regions P as a common layer. The second electrode 215 is a transparent electrode. For example, the second electrode 215 may include a transparent conductive material, e.g., ITO or indium-zinc-oxide (IZO), or a semi-transparent conductive material, e.g., Mg, Ag or Mg—Ag alloy. When the second electrode 215 is a semi-transparent layer, the light extracting efficiency may be improved due to a micro-cavity effect. A capping layer (not shown) may be further formed on the second electrode 215.

When a pre-determined voltage is applied to the first and second electrodes 211 and 215, the hole from the first electrode 211 and the electron from the second electrode 215 combines in the organic emitting layer 213 to generate an exciton. The exciton is transited from an exciting state into a ground state such that the light is emitted from the organic light emitting layer 213. The light from the organic light emitting layer 213 passes through the second electrode 215 such that the flexible OLED device 100 displays images.

A protective film 123, e.g., an encapsulation film, as a thin film is formed on light emitting diode E. For example, after the protective film 123 is disposed over the flexible substrate 110, where the light emitting diode E is formed, the protective film 123 and the flexible substrate 110 are attached such that the flexible OLED device 100 is encapsulated.

The penetration of moisture and/or oxygen may be prevented by the protective film 123. For example, the protective film 123 may include first and second inorganic protective films 123a and 123c and an organic protective film 123b therebetween. The impact resistivity of the first and second inorganic layers 123a and 123c may be compensated by the organic protective film 123b.

A polarization plate 160 may be disposed on the protective film 123 to prevent the contrast ratio decrease by the ambient light reflection. Namely, the polarization plate 160 is positioned in a light transmitting direction to block the ambient light reflection such that the contrast ratio of the flexible OLED device 100 is improved.

The flexible substrate 110 of the flexible OLED device 100 is a thin film having a flexible property (flexibility). The flexible substrate 110 includes a first thin film 110a, a second thin film 110b, and the intermediate blocking layer 120 between the first and second thin films 110a and 110b.

Each of the first and second thin films 110a and 110b includes polyimide (PI). The PI is adequate to form a thin film, and the PI thin film has excellent heat-resisting property, chemically-resisting property, physical property and dimension security. However, the PI thin film has relatively high WVTR (water vapor transmission rate) of about several to several tens $g/(m^2\ day)$.

Accordingly, in a flexible substrate only including a PI thin film, moisture (water vapor, $H_2O$) may easily penetrate through the flexible substrate 110. The $H^+$ ion and $OH^-$ ion in $H_2O$ are diffused into the TFT DTr as the driving element and the switching element, and the diffused ions act as a mobile charge such that the threshold voltage of the TFTs may be shifted. Accordingly, the TFTs may be thermally degraded.

The bottom shield metal pattern 104 is disposed under the active layer 105. Because the bottom shield metal pattern 104 of metal is patterned to correspond to a region, the ions are accumulated in other region such that the thermal degradation of the TFTs is not sufficiently prevented.

However, in the flexible OLED device 100, because the flexible substrate 110 includes the intermediate blocking layer 120 between the first and second thin films 110a and 110b, the penetration of moisture and/or oxygen is sufficiently prevented. The WVTR of the intermediate blocking layer 120 is smaller than the first and second thin films 110a and 110b. Namely, the WVTR of a material of the intermediate blocking layer 120 is smaller than the material, e.g., PI, of the first and second thin films 110a and 110b. For example, the intermediate blocking layer 120 may include an inorganic insulating material, such as silicon nitride (SiNx) or silicon oxide (SiOx).

The intermediate blocking layer 120 is positioned an entire surface of the first and second thin films 110a and 110b except a region 'B' in an edge of the first and second thin films 110a and 110b. Namely, the intermediate blocking layer 120 covers the first thin film 110a in an entirety of the display area A/A and a part of the non-display area N/A. A plane area of the intermediate blocking layer 120 is smaller than that of each of the first and second thin films 110a and 110b. As a result, the penetration of moisture through the flexible substrate 110 is significantly blocked.

The region 'B', where the intermediate blocking layer 120 is not formed, may be defined as an adhesion region. In the region 'B', the first and second thin films 110a and 110b directly contact to each other such that a peeling problem of the first and second thin films 110a and 110b is prevented, minimized, or at least reduce. Accordingly, the penetration of moisture and/or oxygen is further prevented, and the reliability of the flexible OLED device 100 is improved.

In the manufacturing process of the flexible OLED device 100, at least two flexible OLED devices are formed on a mother substrate, and the mother substrate is cut to divide each flexible OLED device. For example, a scribing region of the mother substrate may be cut using a cutting tool, e.g., cutting knife or cutting laser.

When the intermediate blocking layer 120 is formed to have a plane area being equal to the first and second thin films 110a and 110b to cover an entire surface of the first thin film 110a, the intermediate blocking layer 120 as well as the first and second thin films 110a and 110b are cut in the cutting region such that a side of the intermediate blocking layer 120 is exposed and the intermediate blocking layer 120 is disposed between the first and second thin films 110a and 110b at an end of the flexible substrate 110.

The intermediate blocking layer 120 has a difference in a physical or chemical property from the first and second thin films 110a and 110b, and the adhesion strength between the intermediate blocking layer 120 and each of the first and second thin films 110a and 110b is smaller than that between the first and second thin films 110a and 110b. As a result, in the end of the flexible substrate 110, a peeling problem between the intermediate blocking layer 120 and each of the first and second thin films 110a and 110b may be generated.

In this instance, the crack by the peeling problem may be grown into the display area A/A and may be a path of penetration of moisture and/or oxygen. As a result, the TFTs may be thermally degraded, and the reliability of the flexible OLED device 100 may be decreased.

However, in the flexible OLED device 100, because the intermediate blocking layer 120 between the first and second thin films 110a and 110b is positioned in an entirety of the display area A/A and a part of the non-display area N/A except the end region 'B', the first and second thin films 110a and 110b directly contact (directly adhered) to each other in the end region 'B', e.g., the adhesion region. For example, an end of the intermediate blocking layer 120 is positioned to be spaced apart from an end of the first and second thin films 110a and 110b by a pre-determined distance, the flexible substrate 110 may be divided into a first region 'A' and a second region 'B', e.g., the end region 'B'.

All of the first and second thin films 110a and 110b and the intermediate blocking layer 120 are disposed in the first region 'A'. The first region 'A' corresponds to an entirety of the display area A/A and a part of the non-display area N/A, which surrounds and is adjacent to the display area A/A. The first and second thin films 110a and 110b except the intermediate blocking layer 120 are disposed in the second region 'B'. The second region 'B' corresponds to other parts of the non-display area N/A outside the first region 'A'. For example, the flexible substrate 110 has a triple-layered structure of the first thin film 110a, the intermediate blocking layer 120 and the second thin film 110b in the first region 'A' and a double-layered structure of the first and second thin films 110a and 110b in the second region 'B'.

In the first region 'A', the intermediate blocking layer 120 is positioned between the first and second thin films 110a and 110b. In the second region 'B', the first and second thin films 110a and 110b directly contact, and the first and second thin films 110a and 110b in the second region 'B' have high interface adhesion strength. In the flexible OLED device 100, because the intermediate blocking layer 120 is included inside the flexible substrate 110, the penetration of moisture and/oxygen is prevented or reduced without a peeling problem of the first and second thin films 110a and 110b.

The second region 'B' may have a width (along a horizontal direction in FIG. 2) of about 100 to 200 micrometers, but it is not limited thereto. When the width of the second region 'B' is smaller than 100 micrometers, there may be a peeling problem between the first and second thin films 110a and 110b. When the width of the second region 'B' is greater than 200 micrometers, the bezel of the flexible OLED device 100 is increased and/or the penetration of moisture and/or oxygen is insufficiently prevented.

As mentioned above, because the flexible substrate 110 of the flexible OLED device 100 includes the first and second thin films 110a and 110b, which are formed of PI, and the intermediate blocking layer 120 therebetween, the penetration of moisture and/or oxygen is prevented. As a result, the thermal degradation of the TFTs is prevented, and the reliability of the flexible OLED device 100 is improved.

In addition, because the first and second thin films 110a and 110b are directly contacted (adhered) to each other in the second region 'B' without the intermediate blocking layer 120, the peeling problem of the first and second thin films 110a and 110b and generation of crack are prevented. As a result, the penetration of moisture and/or oxygen is further prevented, and the reliability of the flexible OLED device 100 is further improved.

Figure 3A:
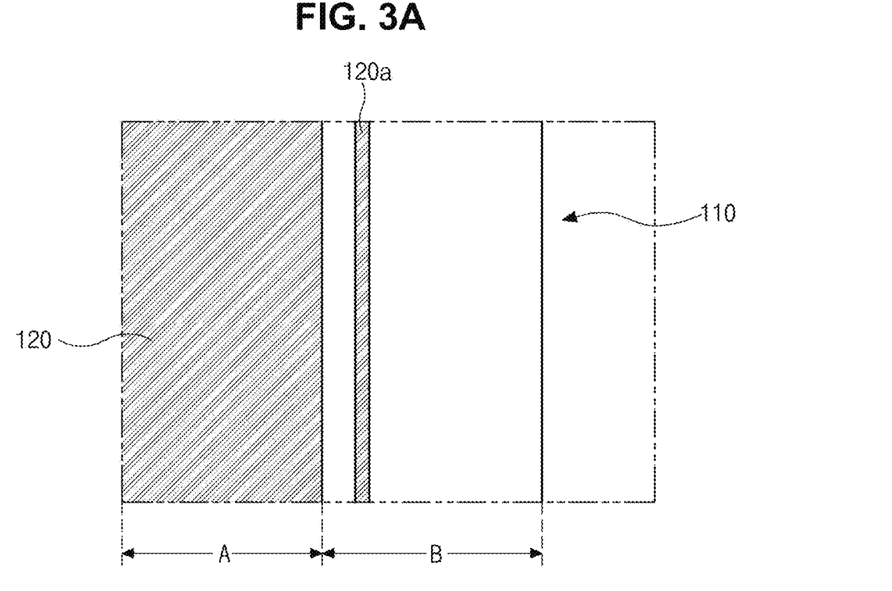
FIGS. 3A and 3B are a schematic enlarged plan view and a schematic cross-sectional view of portion 'C' in FIG. 1, respectively.
Figure 3B:
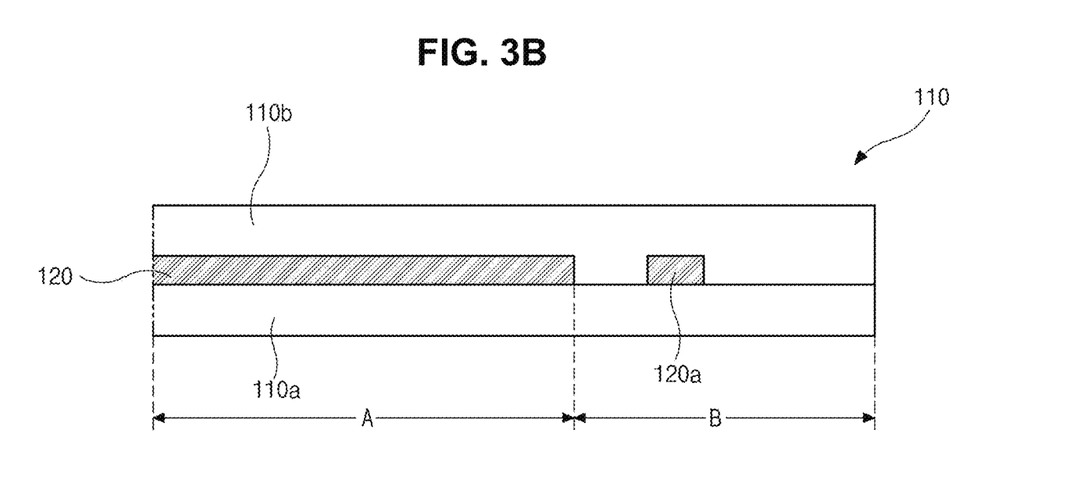

FIGS. 3A and 3B are a schematic enlarged plan view and a schematic cross-sectional view of a 'C' portion of FIG. 1, respectively. FIGS. 4A to 4E are plan views of an intermediate blocking pattern. FIGS. 5A to 5C are schematic plan views of another example of an intermediate blocking layer.

As shown in FIGS. 3A and 3B, the first and second thin films 110a and 110b (of FIG. 2) and the intermediate blocking layer 120 are formed in the first region 'A', and the first and second thin films 110a and 110b and an intermediate blocking pattern 120a are formed in the second region 'B'. Namely, the intermediate blocking pattern 120a is additionally formed in the second region 'B'. The intermediate blocking pattern 120a has a width being smaller than the second region 'B' and is spaced apart from the intermediate blocking layer 120. The intermediate blocking pattern 120a may be formed surrounding the intermediate blocking layer 120.

The interface adhesion strength between the first and second thin films 110a and 110b in the second region 'B' is further improved by the intermediate blocking layer 120. In addition, the penetration of moisture and/or oxygen into the first region 'A' is efficiently blocked by the blocking layer 120.

With reference to FIGS. 4A to 4E, first and second intermediate blocking patterns 120a and 120b may be disposed in the second region 'B' to be spaced apart from and parallel to each other.

Figure 4A:
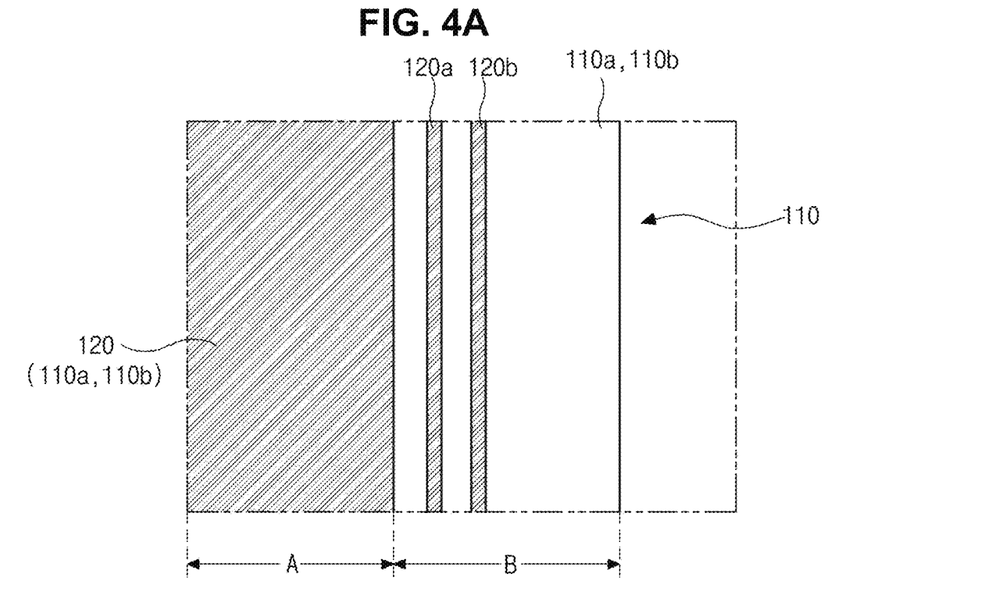
FIGS. 4A to 4E are plan views of an intermediate blocking pattern.
Figure 4B:
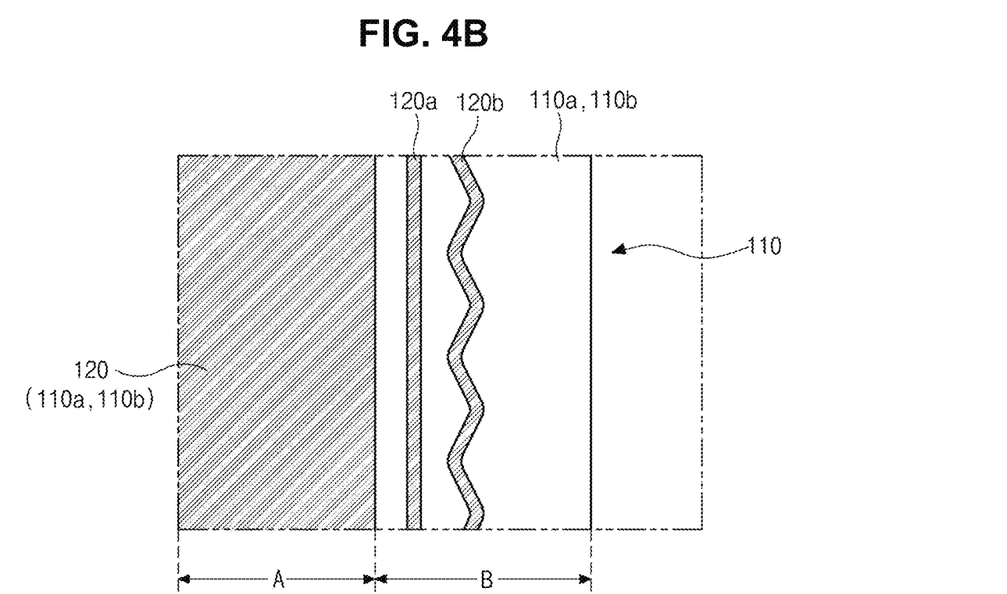
Figure 4C:
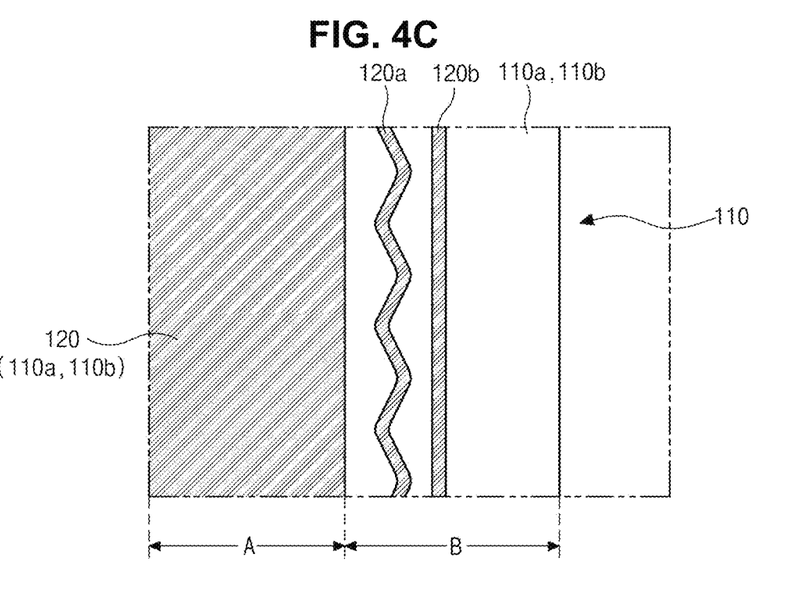
Figure 5A:
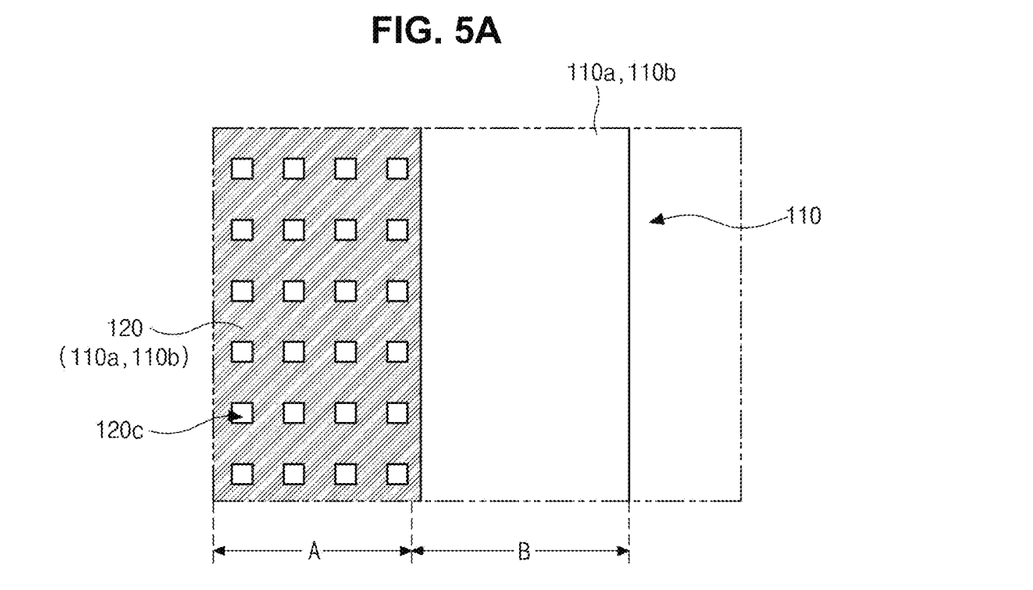
FIGS. 5A to 5C are schematic plan views of another example of an intermediate blocking layer.
Figure 5B:
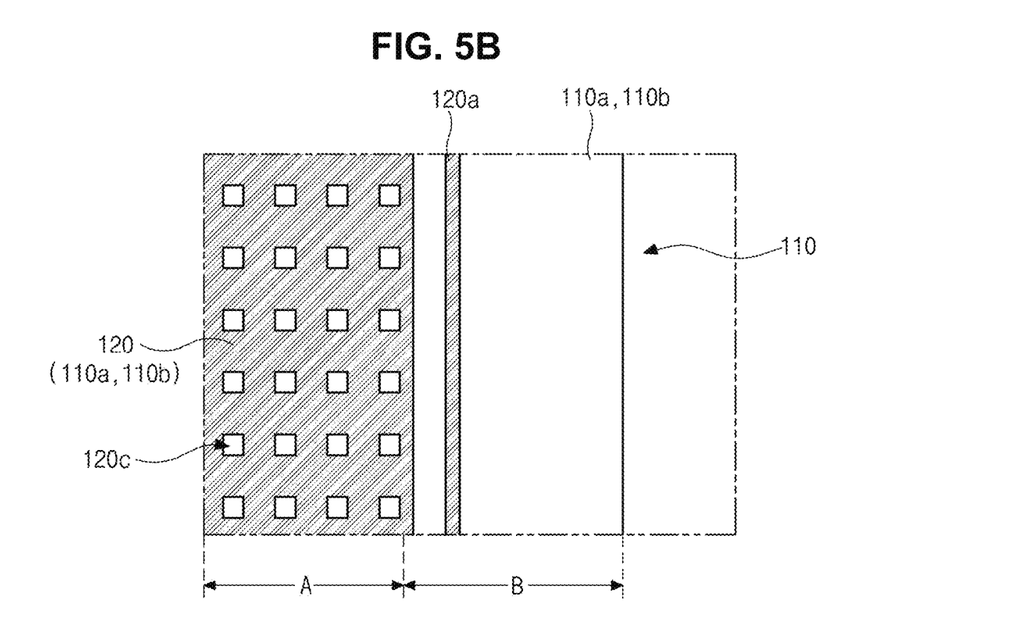
Figure 5C:
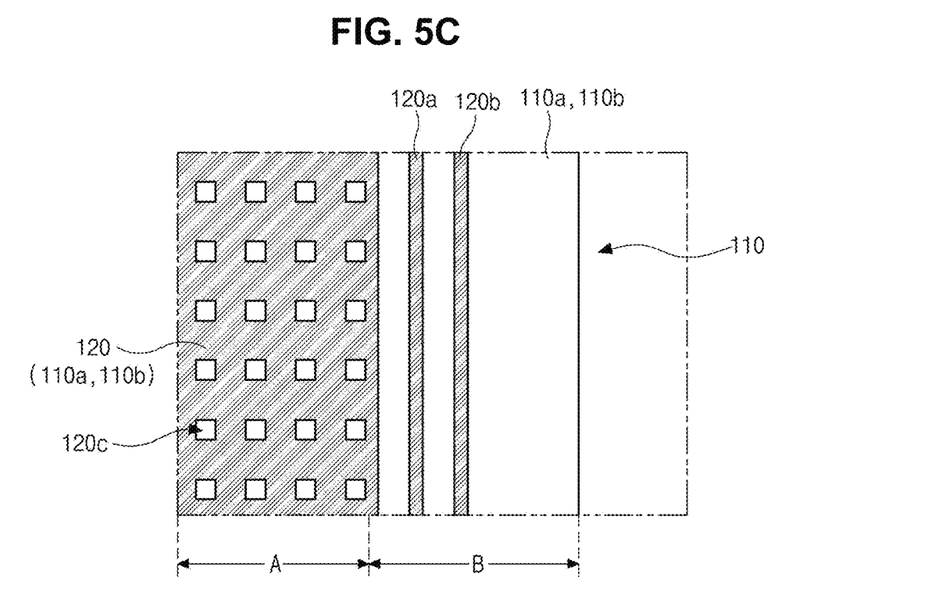

With reference to FIG. 4A, each of the first and second intermediate blocking patterns 120a and 120b may have a linear shape. With reference to FIG. 4B, the first intermediate blocking pattern 120a may have a linear shape, while the second intermediate blocking pattern 120b, which is far away from the intermediate blocking layer 120, may have a zigzag shape or a wavy shape in a plane view. With reference to FIG. 4C, the second intermediate blocking pattern 120b may have a linear shape, while the first intermediate blocking pattern 120a, which is positioned between the intermediate blocking layer 120 and the second intermediate pattern 120b, may have a zigzag shape or a wavy shape in a plane view.

Figure 4D:
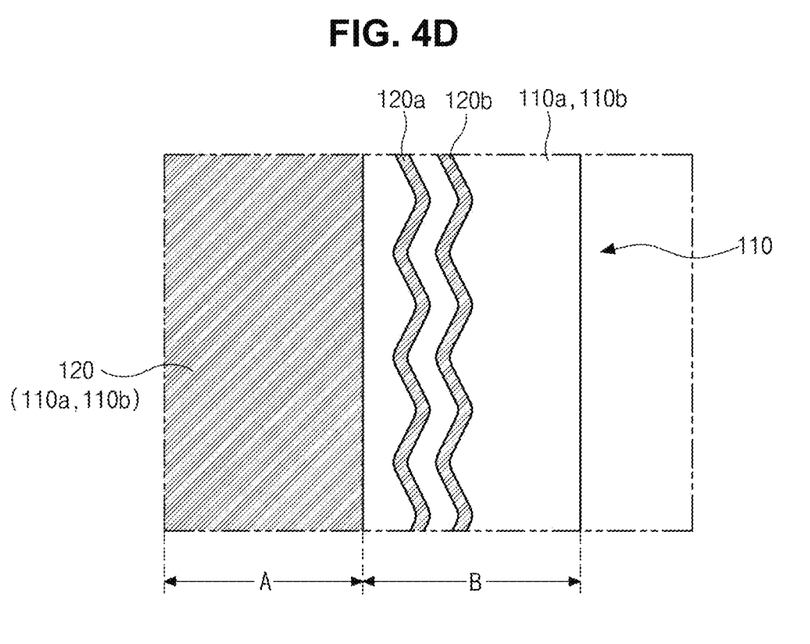
Figure 4E:
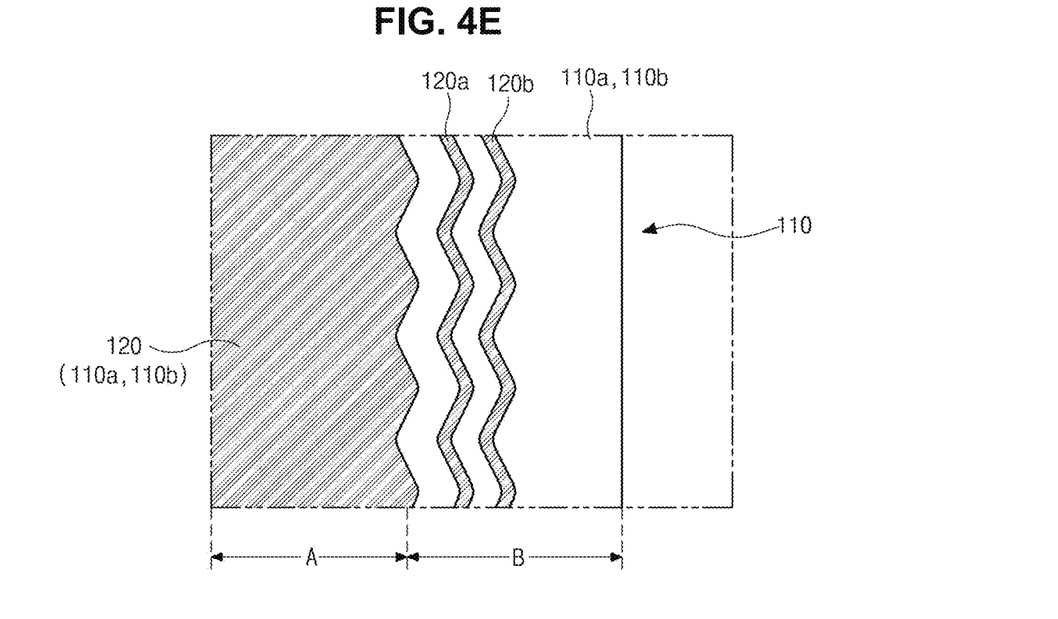

With reference to FIG. 4D, both the first and second intermediate blocking patterns 120a and 120b may have a zigzag shape or a wavy shape in a plane view. With reference to FIG. 4E, all of the first and second intermediate blocking patterns 120a and 120b and an end side of the intermediate blocking layer 120 may have a zigzag shape or a wavy shape in a plane view. Alternatively, the end side of the intermediate blocking layer 120 may have a zigzag shape or a wavy shape in a plane view, while the first and second intermediate blocking patterns 120a and 120b may have a linear shape.

When at least one of the first and second intermediate blocking patterns 120a and 120b have the zigzag shape or the wavy shape in a plane view, the penetration of moisture and/or oxygen is efficiently blocked. In addition, because a contact area between the first and second thin films 110a and 110b is increased, the adhesion strength between the first and second thin films 110a and 110b is further improved.

With reference to FIG. 5A, the intermediate blocking layer 120 in the first region 'A' may include a plurality of openings (or holes) 120c. In this instance, the first and second thin films 110a and 110b in the first region 'A' contacts and are adhered to each other in the openings 120c of the intermediate blocking layer 120 such that the adhesion strength of the first and second thin films 110a and 110b is improved. Accordingly, the peeling problem in the flexible substrate 110 is further prevented.

With reference to FIGS. 5B and 5C, at least one intermediate blocking pattern 120a and 120b may be formed in the second region 'B' with the intermediate blocking layer 120 in the first region 'A' including the openings 120c. In this instance, the penetration of moisture and/or oxygen is efficiently blocked.

As mentioned above, in the flexible OLED device 100, because the flexible substrate 110 includes the first and second thin films 110a and 110b, each of which is formed of PI, and the intermediate blocking layer 120 therebetween, the penetration of moisture and/or oxygen is blocked. As a result, the thermal degradation of the TFTs is prevented, and the reliability of the flexible OLED device 100 is improved. In addition, because the flexible substrate 110 has a triple-layered structure of the first thin film 110a, the intermediate blocking layer 120 and the second thin film 110b in the first region 'A' and a double-layered structure of the first and second thin films 110a and 110b in the second region 'B', the crack resulting from the peeling problem at an end of the flexible substrate 110 is prevented. Moreover, because the intermediate blocking pattern is formed in a part of the second region 'B', the penetration of moisture and/or oxygen is further blocked, and the adhesion strength between the first and second thin films is improved.

It will be apparent to those skilled in the art that various modifications and variations can be made in the flexible substrate and the flexible organic light emitting diode device of the present disclosure without departing from the spirit or scope of the disclosure. Thus, it is intended that the present disclosure cover the modifications and variations of this disclosure provided they come within the scope of the appended claims and their equivalents.

What is claimed is:

1. A flexible substrate, comprising:
   a first flexible thin film including a first region and a second region surrounding the first region, the first region including a switching region, a storage region, and a pad region;
   a second flexible thin film on the first flexible thin film and in the first and second regions; and
   an intermediate blocking layer between the first and second flexible thin films and in an entirety of the first region,
   wherein the first flexible thin film directly contacts the second flexible thin film in at least one part of the second region.

2. The flexible substrate according to claim 1, wherein each of the first and second flexible thin films include polyimide.

3. The flexible substrate according to claim 2, wherein the first and second flexible thin films are formed of a same material.

4. The flexible substrate according to claim 1, wherein the intermediate blocking layer includes an inorganic insulating material of one of silicon nitride and silicon oxide.

5. The flexible substrate according to claim 1, further comprising:
   a first intermediate blocking pattern in the second region,
   wherein the first intermediate blocking pattern is spaced apart from the intermediate blocking layer.

6. The flexible substrate according to claim 5, further comprising:

a second intermediate blocking pattern in the second region, wherein the first intermediate blocking pattern is between the intermediate blocking layer and the second intermediate blocking pattern and is spaced apart from the intermediate blocking layer and spaced apart from the second intermediate blocking pattern.

7. The flexible substrate according to claim 6, wherein at least one of the first and second intermediate blocking patterns has a zigzag or wavy shape.

8. The flexible substrate according to claim 6, wherein an end side of the intermediate blocking layer facing the first intermediate blocking pattern has a zigzag or wavy shape.

9. The flexible substrate according to claim 1, wherein the intermediate blocking layer includes a plurality of openings in the first region.

10. The flexible substrate according to claim 1, wherein a width of the second region has a range of 100 to 200 micrometers.

11. The flexible substrate according to claim 1, wherein the intermediate blocking layer is absent in the second region surrounding the first region such that the second flexible thin film directly contacts the first flexible thin film in the second region.

12. A flexible organic light emitting diode device, comprising:
a flexible substrate including a first flexible thin film, a second flexible thin film, and an intermediate blocking layer between the first and second flexible thin films, wherein the flexible substrate having a first region and a second region surrounding the first region, and a plurality of pixel regions are defined in the first region, and wherein the first region includes a switching region, a storage region, and a pad region;
a thin film transistor in each pixel region; and
a light emitting diode in each pixel region and connected to the thin film transistor,
wherein the intermediate blocking layer is in an entirety of the first region such that the first flexible thin film directly contacts the second flexible thin film in at least one part of the second region.

13. The flexible organic light emitting diode device according to claim 12, wherein each of the first and second flexible thin films includes polyimide.

14. The flexible organic light emitting diode device according to claim 12, wherein the intermediate blocking layer includes an inorganic insulating material of silicon nitride or silicon oxide.

15. The flexible organic light emitting diode device according to claim 12, further comprising:
a first intermediate blocking pattern in the second region,
wherein the first intermediate blocking pattern is spaced apart from the intermediate blocking layer.

16. The flexible organic light emitting diode device according to claim 15, further comprising:

a second intermediate blocking pattern in the second region, wherein the first intermediate blocking pattern is between the intermediate blocking layer and the second intermediate blocking pattern and is spaced apart from the intermediate blocking layer and the second intermediate blocking pattern.

17. The flexible organic light emitting diode device according to claim 16, wherein at least one of the first and second intermediate blocking patterns has a zigzag or wavy shape, and
wherein an end side of the intermediate blocking layer facing the first intermediate blocking pattern has a zigzag or wavy shape.

18. The flexible organic light emitting diode device according to claim 12, wherein the intermediate blocking layer includes a plurality of openings in the first region.

19. The flexible organic light emitting diode device according to claim 12, wherein a width of the second region has a range of 100 to 200 micrometers.

20. A flexible substrate, comprising:
a first flexible thin film including a first region and a second region surrounding the first region;
a second flexible thin film on the first flexible thin film and in the first and second regions; and
an intermediate blocking layer between the first and second flexible thin films and in the first region,
wherein the intermediate blocking layer includes a plurality of openings in the first region, and the first flexible thin film directly contacts the second flexible thin film in the plurality of openings, and
wherein the plurality of openings are spaced apart from each other.

21. The flexible substrate according to claim 20, further comprising:
a first intermediate blocking pattern in the second region,
wherein the first intermediate blocking pattern is spaced apart from the intermediate blocking layer.

22. The flexible substrate according to claim 21, further comprising:
a second intermediate blocking pattern in the second region,
wherein the first intermediate blocking pattern is between the intermediate blocking layer and the second intermediate blocking pattern and is spaced apart from the intermediate blocking layer and spaced apart from the second intermediate blocking pattern.

23. The flexible substrate according to claim 22, wherein at least one of the first and second intermediate blocking patterns has a zigzag or wavy shape.

24. The flexible substrate according to claim 22, wherein an end side of the intermediate blocking layer facing the first intermediate blocking pattern has a zigzag or wavy shape.

* * * * *